United States Patent [19]

Ikegami

[11] E Re. 30,466

[45] Reissued Dec. 30, 1980

[54] METHOD AND DEVICE FOR GENERATING A MAGNETIC FIELD OF A POTENTIAL WITH ELECTRIC CURRENT COMPONENTS DISTRIBUTED ACCORDING TO A DERIVATIVE OF THE POTENTIAL

[76] Inventor: Hidetsugu Ikegami, 9-16, Tsurukawa 3-chome, Machida-shi, Tokyo, Japan

[21] Appl. No.: 48,153

[22] Filed: Jun. 13, 1979

Related U.S. Patent Documents

Reissue of:

[64] Patent No.: 4,153,889
Issued: May 8, 1979
Appl. No.: 773,312
Filed: Mar. 1, 1977

[30] Foreign Application Priority Data

Mar. 19, 1976 [JP] Japan ..... 51-29266

[51] Int. Cl.[3] ..... H01F 5/00

[52] U.S. Cl. ..... 335/213; 335/209

[58] Field of Search ..... 335/213, 212, 210, 209, 335/306; 328/230, 233, 234, 236; 313/231.3, 231.4; 315/111.4, 111.5, 111.6

[56] References Cited

U.S. PATENT DOCUMENTS 3,781,732 12/1973 Wollnik ..... 335/213

*Primary Examiner*—Harold Broome

*Attorney, Agent, or Firm*—Hopgood, Calimafde, Kalil, Blaustein & Lieberman

[57] ABSTRACT

A device for producing a 2 N-pole magnetic field in a rhombic or a rectangular prismal space comprises 2 N sets of conductors extended axially of the space along a yoke inside surface defining the space. Electric currents are caused to flow through the conductors with a current density distribution given by $-d\phi/ds$ where $\phi$ and ds represent a potential for the field and a differential line element directed perpendicularly along the yoke inside surface of the prism axis. The current density distribution is generalized, for production of a general static magnetic field, to current components perpendicular to a plane intersecting the yoke inside surface at a plane curve, when ds represents a differential line element tangential to the curve.

28 Claims, 17 Drawing Figures

METHOD AND DEVICE FOR GENERATING A MAGNETIC FIELD OF A POTENTIAL WITH ELECTRIC CURRENT COMPONENTS DISTRIBUTED ACCORDING TO A DERIVATIVE OF THE POTENTIAL

Matter enclosed in heavy brackets [ ] appears in the original patent but forms no part of this reissue specification; matter printed in italics indicates the additions made by reissue.

BACKGROUND OF THE INVENTION

This invention relates to a method and a device, such as an electromagnet, for generating in a hollow space a magnetic field derived from a static magnetic potential.

A device of the type described is used in a corpuscular-ray analyser, a particle accelerator, an corpuscular-ray bending and/or focusing device, a plasma producing device, or the like in controlling the path of charged particles. As will later be described with reference to a few figures of the accompanying drawing, a conventional device of the type described has to be precisely machined during manufacture and is unduly bulky as compared with the space in which the magnetic field is to be generated. Furthermore, it is difficult with a conventional device of the type described to adjust the magnetic field and to render the space sufficiently wide.

According to Applicant's prior invention which is disclosed in a Japanese patent application filed Aug. 21, 1975, and published Feb. 25, 1977, a device of the type described is proposed whereby a 2N pole magnetic field is generated in a substantially rectangular, rhombic, square, or equilateral hexagonal or octagonal prismal space. A device according to the prior invention comprises a hollow prismal yoke having 2N inside lateral surfaces. Conductors are extended axially along the respective inside lateral surfaces of the space and at least inwardly of the lateral surfaces. When the yoke is of a hollow rectangular prismal shape, use is made of a rectangular x-y coordinate system with the x and y axes perpendicularly bisecting x and y inside surfaces, respectively. Density of the conductors arranged along the x and y inside surfaces is given by $y^{N-2}$ and $x^{N-2}$, respectively. When the yoke is of a hollow rhombic prismal shape, N should be equal to three or more. A sextipole and an octopole magnetic field may be produced by the use of a hollow hexagonal and a hollow octagonal prismal yoke respectively. The prior invention also provides a combination of devices for producing 2N-pole magnetic fields wherein the number N is adjusted to provide a first through an (N−1)-th order convergence for a charged particle beam.

With a device according to the prior invention, it is possible to avoid the precise machining, to render the device astonishingly compact, to adjust the magnetic field, and to widen the space. It is, however, impossible to provide a static magnetic field of a more general distribution in a hollow space of an optional shape. Furthermore, the conductors arranged inwardly of the yoke inside surface restrict the space in which the magnetic field is produced.

SUMMARY OF THE INVENTION

It is therefore an object of the present invention to provide a method and a 2N-pole device for generating a magnetic field of a static magnetic potential in a hollow space, wherein the field is not restricted to a known 2N-pole magnetic field and wherein the space is not restricted to an equilateral polygonal prismal space.

It is another object of this invention to provide a method and a device of the type described, whereby it is possible to widen the space than that achieved by the above-described prior invention.

It is a subordinate object of this invention to provide a method of the type described, wherefor precise machining is unnecessary during manufacture of a device for use in carrying out the method and whereby the magnetic field is readily adjustable.

It is another subordinate object of this invention to provide a device of the type described, which need no precise machining during manufacture and with which the magnetic field is readily adjustable.

According to this invention, there is provided a method of generating a 2N-pole magnetic field in a hollow space, N being representative of an integer, wherein the magnetic field is derived from a static magnetic potential $\phi$ defined in the space. The method comprises the steps of providing a yoke member having an inside surface which defines the space and gives a plane curve when cut or sectioned by a plane, providing a coil member having current paths along the yoke member inside surface and transversely of the plane, and causing electric currents to flow through the respective current paths with a density distribution of those components of the electric currents which are perpendicular to the plane. The distribution is given by $-d\phi/ds$ where ds represents a differential line element tangential to the plane curve, said yoke member not having a parallel inside surface along which said current paths are arranged for generation of the magnetic field for N=1.

According to this invention, there is also provided a device for generating a magnetic field in a hollow space wherein the magnetic field is derived from a static magnetic potential $\phi$ defined in the space. The device comprises a yoke member having an inside surface which defines the space and gives a plane curve when cut by a plane said device further comprising, a coil member having current paths along the yoke members inside surface and transversely of the plane, said current path being arranged for causing electric currents to flow there through with a distribution of components perpendicular to the plane of electric currents being equal to $-d\phi/ds$ where ds represents a differential line element tangential to the plane curve, said yoke member not having a parallel inside surface along which said current paths are arranged for generation of the magnetic field for N=1.

DESCRIPTION OF THE PREFERRED EMBODIMENTS

Figure 1:
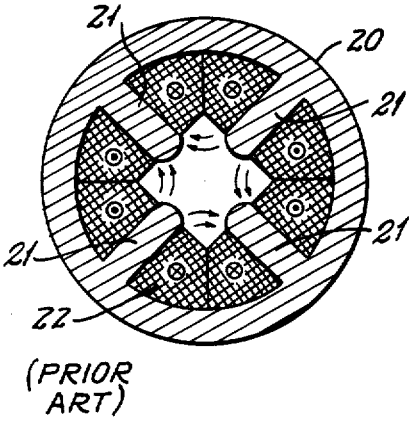
FIG. 1 shows a cross section of a conventional device for generating a quadrupole magnetic field.

Referring to FIG. 1, description will be made of a conventional device for producing a quadrupole magnetic field in order to facilitate an understanding of the present invention. The device comprises a hollow circular cylindrical yoke 20 having an inside surface, four pole pieces 21 radially inwardly projected from four azimuthally equally spaced generating lines of the inside surface, and conductors 22 parallel to the center axis of the space. The conductors 22 are connected on both axial ends of the yoke 20 so as to form four coils wound around the respective pole pieces 21. Each of the pole pieces 21 has a radially inward end surface machined in conformity with a magnetic equipotential surface of the quadrupole field. The magnetic field is produced by causing an electric current to flow through each of the coils in senses indicated by encircled dots and crosses. With this device, a space in which the magnetic field is produced is considerably narrower than the yoke 20. Leakage flux is considerably large so that the yoke 20 must have a thick wall. The magnetic field actually produced is generally inconsistent with the design due to the hysteresis, among others, of the magnetic material of the yoke 20 and the pole pieces 21 whatever care may be taken to insure the uniformity of the material. On correcting the discrepancy, it is possible to only locally adjust the magnetic field by shimming, namely, by insertion of iron pieces. Moreover, it is impossible to adjust the whole magnetic field. For use in disposing of a beam of charged particles, the gap provided by the radially inward end surfaces is not sufficiently wide at a location along the beam where a wide gap is desirable for the purpose of, for example, focusing the beam.

Figure 2:
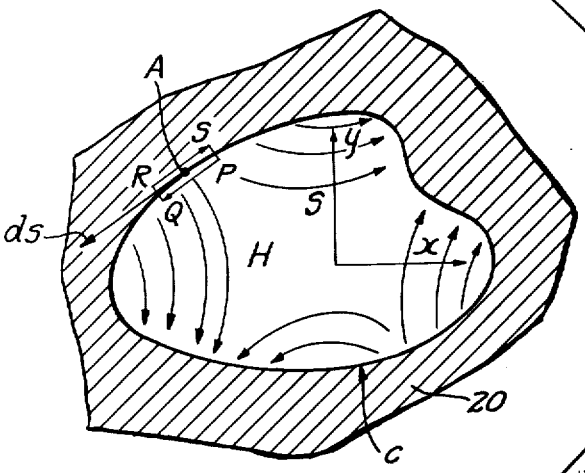
FIG. 2 illustrates a cross section of a device for describing the principles of the present invention.

Referring to FIG. 2, a space S in which a magnetic field H derived from a static magnetic potential $\phi$ is to be produced is surrounded by an inside surface of a yoke 20 of a magnetic material. When cut by an intersecting plane, the yoke inside surface gives a plane curve C. A curvilinear u-v-w coordinate system (not shown) is considered, the u and v coordinate defining points on the intersecting planes. The w axis runs along a locus of a specific point on each intersecting plane, such as the center of gravity of the intersecting plane. When the magnetic permeability of the yoke material is infinitely large, no magnetic field is present within the yoke 20. The yoke inside surface is a magnetic equipotential surface when no electric charges are moving therealong. The yoke inside surface is no more an equipotential surface to provide a certain magnetic field in the space S when charges move therealong. From this fact, it follows that a desired magnetic field is produced in the space S by controlling distribution of current densities along the yoke inside surface. According to Stokes' theorem applied to a closed curve passing through points P, Q, R, and S around a point A on the plane curve C, $$\int_{P\to Q} j\,ds = \int_{P\to Q} H_s\,ds = -\int_{P\to Q}(d\phi/ds)\,ds, \tag{1}$$

where j represents the density of that component of an electric current flowing through the point A which is perpendicular to the intersecting plane, $H_s$ represents that component of the magnetic field H at the point A which is tangential to the plane curve C, and ds represents a differential line element tangential to the curve C. From Equation (1):

$$j = -d\phi/ds \tag{2}$$

follows, which gives the distribution along the curve C of the above-mentioned current component for generating the magnetic field H. It is now understood that the magnetic field H is realized by providing current paths, as by arranging conductors, along the yoke inside surface and transversely of the intersecting plane and by causing an electric current to flow through each current path with a density distribution of those components of the electric currents which are perpendicular to the intersecting plane rendered equal to $-d\phi/ds$. Equations (1) and (2) approximately hold even when the magnetic permeability is finite and even when the thickness of the conductors used as the current paths is not negligible.

Further referring to FIG. 2, it should be pointed out that Equations (1) and (2) are independent of the coordinate system considered. A rectangular x-y-z coordinate system is therefore considered. Furthermore, let it be assumed that the depicted plane curve C is given by an intersection of a yoke inside surface defining a hollow cylindrical space and a plane perpendicular to the cylinder axis along which the z axis runs. Let the magnetic field H be a 2N-pole one (a quadrupole one being illustrated) defined by a static magnetic potential $\theta_{2N}$ given by:

$$\phi_{2N} = -\mathrm{Im}(x+iy)^N = -r^N \sin(N\theta), \tag{3}$$

where $r=(x^2+y^2)^{\frac{1}{2}}$ and $\theta=\arctan(y/x)$. From Equation (2), the distribution of the current components is given by:

$$\begin{aligned} j &= -d\phi_{2N}/ds \\ &= N[\cos\alpha.\mathrm{Im}(x+iy)^{N-1} + \sin\alpha.\mathrm{Re}(x+iy)^{N-1}] \\ &= Nr^{N-1}\sin(\alpha+[N-1]\theta), \end{aligned} \tag{4}$$

where $\alpha$ represents an angle measured in the counterclockwise from the x axis to a tangent to the curve C. Most practically, the distribution of the current components is realized by arranging current paths (not shown in FIG. 2) along the generating line of the yoke inside surface, namely, parallel on the yoke inside surface to the cylinder axis, with a distribution of the current path density in conformity with Equation (4) and by causing an equal electric current to flow through each current path with senses selected to realize the current density distribution given by Equation (4).

As will later be exemplified with reference to FIG. 3, a rectangular x-y-z coordinate system is considered in connection with a yoke defining a hollow prismal space of a cross section of a regular polygon of 2N sides. The z axis is disposed along the center axis of the prismal space. Let a 2N-pole magnetic field be generated within the hollow space with poles placed along the edges of the prismal space. When the x axis perpendicularly bisects a selected side or lateral surface of the prismal space, points on the selected side have the same abscissa, such as $x_0$. Under the circumstances, Equation (4) is rewritten into:

$$j_A = -d\phi_{2N}/ds = \mathrm{Im}[d(x_0+iy)^N/dy]$$
$$= \mathrm{Im}[Ni(x_0+iy)^{N-1}]. \quad (4a)$$

Inasmuch as it is usual or desired for provision of a wide space that the common width of the side surfaces is smaller than the common distance between the opposing pairs of the 2N side surfaces, $$\left.\begin{array}{ll} j = 2x_0 & (\text{for } N = 2), \\ \text{and} & \\ j \approx Nx_0^{N-1} & (\text{for } N \neq 1, 2). \end{array}\right\} \quad (4b)$$

Equations (4a) and (4b) similarly hold for whichever of the 2N side surfaces. It is now possible to produce the 2N-pole magnetic field by causing electric currents having z components given by Equation (4b) to flow along the yoke inside surfaces. More practically, the currents may be caused to flow through tape-shaped conductors extended along the yoke inside surfaces with the senses of the current flow reversed in two adjacent ones of the conductors.

Figure 3:
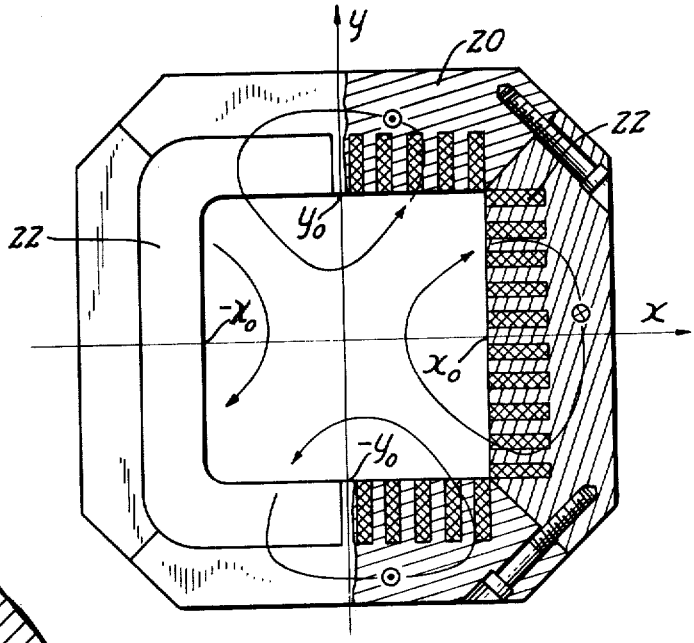
FIG. 3 is a front view, with parts cut away, of a device according to a first embodiment of this invention.

Referring to FIG. 3, a device according to a first embodiment of this invention comprises a yoke 20 mentioned hereinabove in connection with production of a 2N-pole magnetic field in a hollow regular 2N'gonal prismal space. In the example being illustrated, N is equal to two. From Equation (4b), z components $j_x$ and $j_y$ of the electric currents to be caused to flow along the side surfaces intersecting the x and y axes at $x_0$ and $y_0$, respectively are:

$$\left.\begin{array}{l} jx = 2x_0 \\ \text{and} \\ jy = 2Y_0. \end{array}\right\} \quad (4c)$$

In order to readily realize the current distribution, the depicted device further comprises conductors 22 extended along the yoke inside surfaces in the direction of the z axis. As symbolized by those portions of the coil member 22 which are depicted on the left half of the figure, the conductors 22 are connected on both ends of the yoke 20 so as to form a coil member which consists of a plurality of coils mentioned hereinabove. Alternatively, the conductors 22 may be connected by return windings (not shown) disposed along the outside surface of the yoke member 20. When $x_0 = y_0$, the conductors 22 may be equally spaced. Equal electric currents may be caused to flow through the coils 22 in the senses illustrated by encircled dots and crosses as in FIG. 1. The coil member 22 is buried or embedded in the yoke so as to widen the space rather than disposed inwardly of the yoke inside surface as disclosed in the prior patent application mentioned in the preamble of the instant specification. It is possible to embed some of the conductors 22 in the yoke member 20 and to make others inwardly protrude from the yoke member inside surface particularly at that portion or those portions of the yoke where magnetic saturation is liable to occur.

Figure 4:
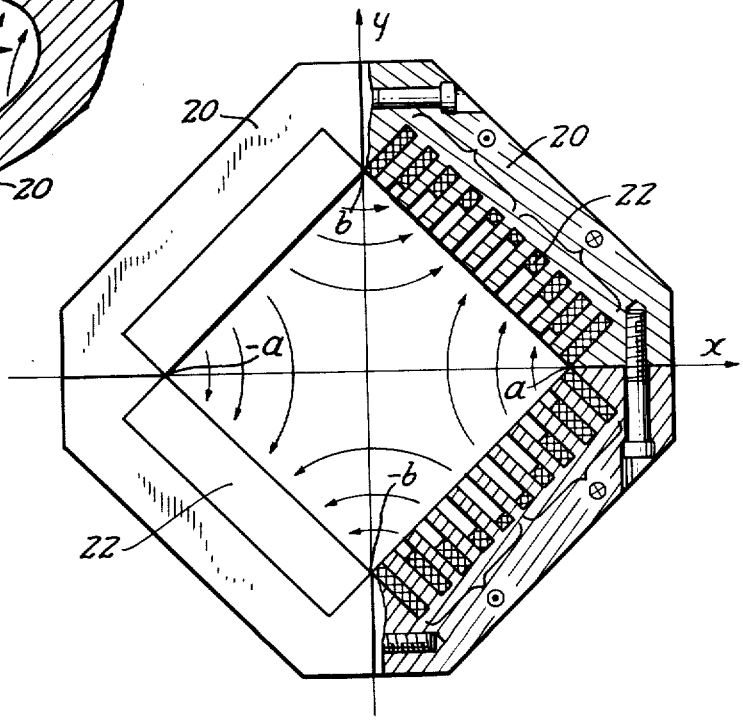
FIG. 4 is a similar view of a device according to a second embodiment of this invention.

Referring to FIG. 4, a device according to a second embodiment of this invention is for generating a 2N-pole magnetic field again in a hollow prismal space having a cross section of an equilateral quadrilateral with the poles placed along the center lines of the respective side surfaces of the prismal space rather than along edges as illustrated with reference to FIG. 3. In the illustrated example, N is once again equal to two whereas N should be equal to three or more according to the prior invention summarized hereinabove. A rectangular x-y-z coordinate system is considered with the x and y axes passing through the edges of a prismal space and with the z axis extended along the center axis of the space. The device comprises a yoke 20 having inside surfaces given by:

$$x/a + y/b = 1, \quad (5)$$

where a and b represent x and y intercepts of one of the inside lateral surface of the yoke 20. From Equation (4), the z components j of the electric currents to be caused to flow along the yoke inside surface should be distributed as:

$$j = 2[\cos\alpha.\mathrm{Im}(x+iy) + \sin\alpha.\mathrm{Re}(x+iy)]. \quad (6)$$

Elimination of y from Equations (5) and (6) gives:

$$j = \mathrm{Im}(2[x+ib(1-x/a)][1-ib/a]). \quad (6a)$$

When a=b, $$j = 2(a-2x).$$

The device therefore comprises a coil member 22 which may comprise, in turn, conductor groups extended in the direction of the z axis and embedded in the yoke 20. On each yoke inside surface, the conductor groups may be equally spaced with the number of conductors in the respective groups linearly decreased from a predetermined number on both ends of the yoke inside surface to zero at the center as symbolically illustrated in FIG. 4. The conductors are connected on both ends of the yoke 20 so as to enable electric currents to be made to flow in the senses depicted also in FIG. 4. When the 2N-pole field should be produced instead of the quadrupole field in the hollow equilateral quadrilateral space, the z component j of the electric current is given by:

$$j = \mathrm{Im}(N[x+ib(1-x/a)]^{N-1}[1-ib/a]). \quad (6b)$$

Figure 5:
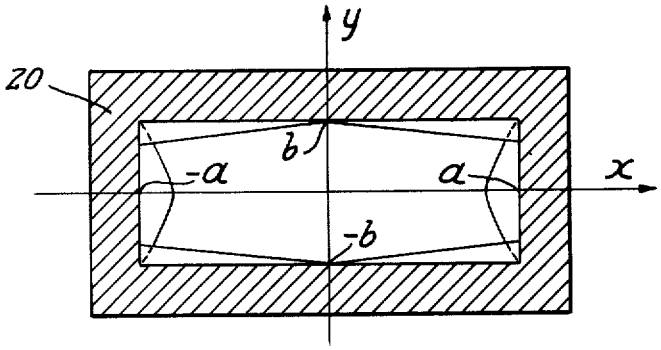
FIG. 5 is a similar view of a device according to a third embodiment of this invention.

Referring to FIG. 5, a device according to a third embodiment of this invention is for generating a sextipole magnetic field in a hollow rectangular prismal space defined by four inside surfaces of a yoke 20. A rectangular x-y-z coordinate system is defined so that the z axis runs along the center axis of the hollow space and that the yoke inside surfaces perpendicularly intersect the x and y axes at x=a, x=−a, y=b, and y=−b.

From Equation (3), the static magnetic potential $\phi_6$ of the sextipole magnetic field is:

$$\phi_6 = -3x^2y + y^3.$$

From Equation (2), z components $j_x$ of an electric current to be caused to flow along the yoke inside surface at a point on the yoke inside surfaces intersecting the x axis are:

$$j_x = -d\phi_6/dy = 3a^2 - 3y^2.$$

The distribution of the z components $j_x$ along these yoke inside surface is parabolic as exemplified in FIG. 5. Likewise, z components $j_y$ of an electric current to be made to flow at a point on the yoke inside surfaces intersecting the y axis are:

$$j_y = -d\phi_6/dx = 6bx.$$

The distribution is linear as depicted also in FIG. 5. From the devices according to the first and second embodiments, it is now readily possible for those skilled in the art to realize the current component distributions by a simplest possible arrangement of a coil member comprising conductors extend parallel to the z axis. The z component distribution $j_x$ along the yoke inside surface intersecting the x axis is different from those taught in the above-cited Japanese patent application.

Figure 6:
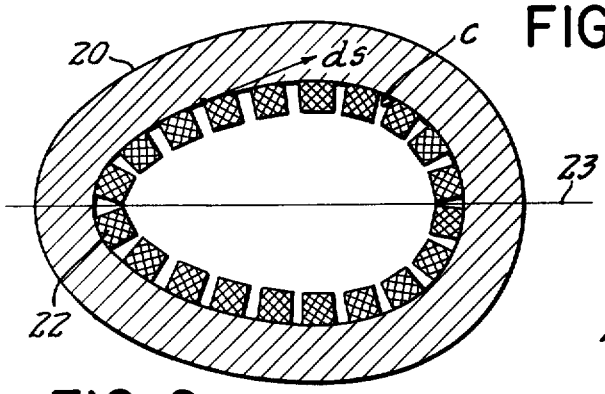
FIG. 6 is a cross-sectional view of a device according to a fourth embodiment of this invention.

Referring to FIG. 6, a device according to a fourth embodiment of this invention comprises a yoke member 20 having an inside surface which surrounds a hollow cylindrical space. The yoke member 20 consists of a single yoke which gives a plane curve C when cut by a plane perpendicular to the cylinder axis. The curve C is symmetric with respect to a line 23. When a magnetic field H should be generated in the space, electric currents should be caused to flow along the yoke inside surface with the z components j given by Equation (2) where ds represents a differential line element tangential to the curve C. As described with reference to FIGS. 3 through 5 hereinabove, it is possible to realize the distribution of the z components j by a coil member 22 comprising a plurality of discrete current path or conductor groups extended parallel to the cylinder axis. In the depicted example, the coil member 22 is protruded inwardly of the yoke inside surface as in a device according to the above-mentioned prior invention.

Figure 7:
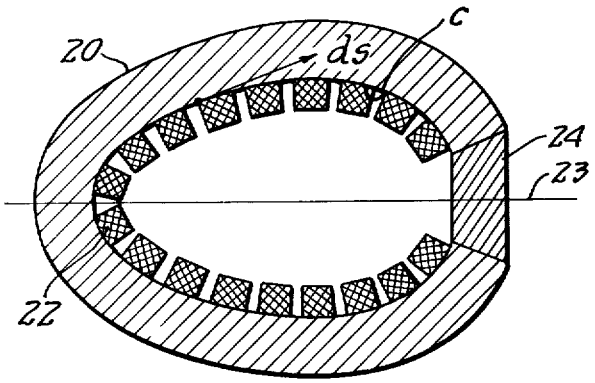
FIG. 7 is a cross-sectional view of a device according to a fifth embodiment of this invention.

Referring to FIG. 7, a device according to a fifth embodiment of this invention is similar to that illustrated with reference to FIG. 6 except that the yoke member 20 comprises a single yoke having a pair of edges extended parallel to the cylinder axis. The edges may be connected by a non-magnetic spacer or spacers 24.

Figure 8:
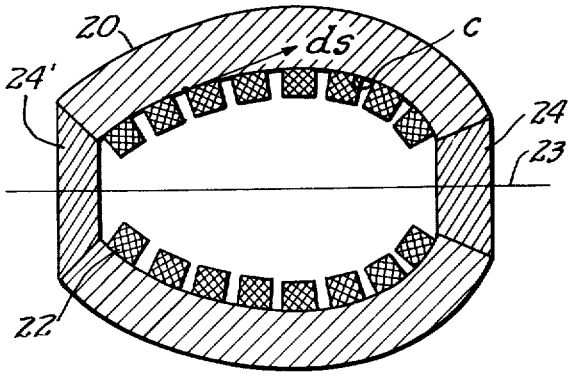
FIG. 8 is a cross-sectional view of a device according to a sixth embodiment of this invention.

Referring to FIG. 8, a device according to a sixth embodiment of this invention is similar to that illustrated with reference to FIG. 7 except that the yoke member 20 comprises a plurality of yokes, each having a pair of edges extended parallel to the cylinder axis. In the depicted example, the edges are connected by non-magnetic spacers 24 and 24'.

In connection with a device according to the fifth or sixth embodiment, it will now be understood that the curve C may not have a line of symmetry. However, the yoke member 20 may comprise one or more yokes, each having a pair of edges extended transversely of the plane with a space curve interposed. Preferably, the space curve is a locus of points where a pole appears.

Figure 9:
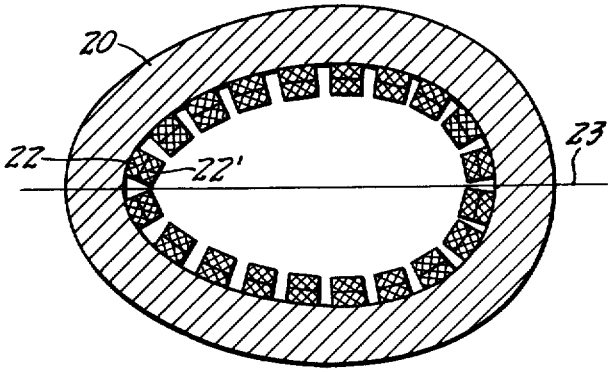
FIG. 9 is a cross-sectional view of a device according to a seventh embodiment of this invention.

Referring to FIG. 9, a device according to a seventh embodiment of this invention is again similar to that illustrated with reference to FIG. 6 except that the coil member 22 comprises two layers of coils 22 and 22' for providing current component distributions according to $-d\phi/ds$ and $-d\phi'/ds$ where $\phi'$ represents another static magnetic potential from which an additional magnetic field H' is derived in superposition on the above-mentioned basic magnetic field H to produce a composite magnetic field. When use is made as the additional magnetic field of a higher order field of the basic one, it is possible to minimize the aberration of the focus of a beam of charged particles. If desired, only one of the coil layers 22 and 22' may be used so as to generate a selected one of the basic and the so-called additional magnetic fields.

Figure 10:
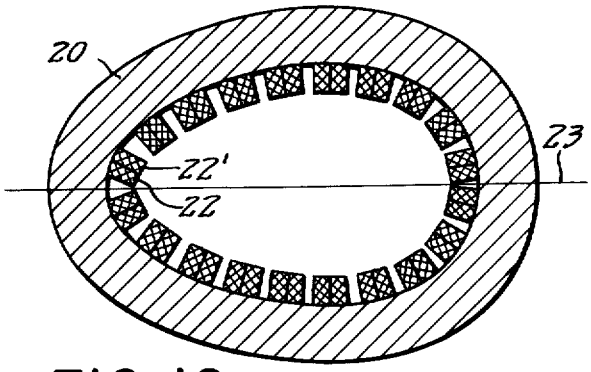
FIG. 10 is a cross-sectional view of a device according to an eighth embodiment of this invention.

Referring to FIG. 10, a device according to an eighth embodiment of this invention is similar to that according to the seventh embodiment. Two kinds of coils 22 and 22' are, however, arranged in one layer on the yoke inside surface. It is unnecessary that the coils 22 and 22' be alternatingly arranged as illustrated.

Figure 11:
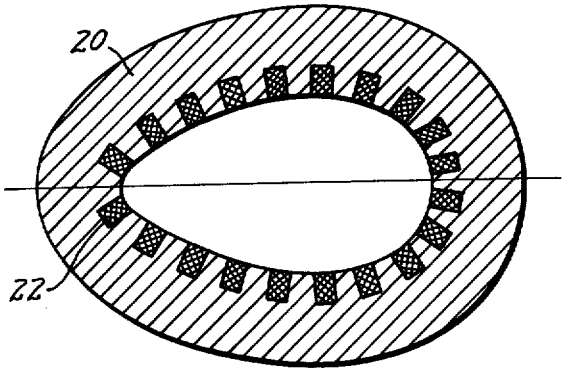
FIG. 11 is a cross-sectional view of a device according to a ninth embodiment of this invention.

Referring to FIG. 11, a device according to a ninth embodiment of this invention is once again similar to that illustrated with reference to FIG. 6. The coil member 22, however, is buried in the yoke member 20.

Figure 12:
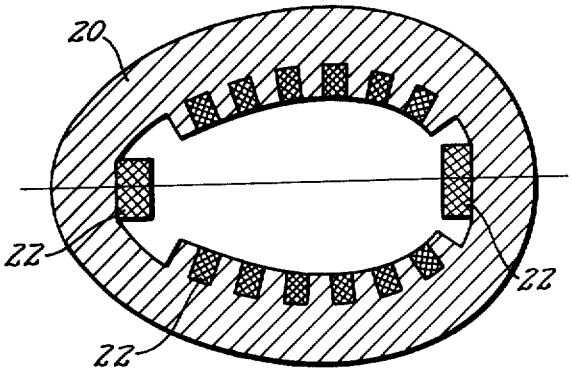
FIG. 12 is a cross-sectional view of a device according to a tenth embodiment of this invention.

Referring to FIG. 12, a device according to a tenth embodiment of this invention is similar to that depicted in FIG. 11. The coil member 22 comprises two conventional coils at portions where the yoke has small radii of curvature and additional coils arranged between the conventional coils for modifying as desired the magnetic field produced by the conventional coils.

Figure 13:
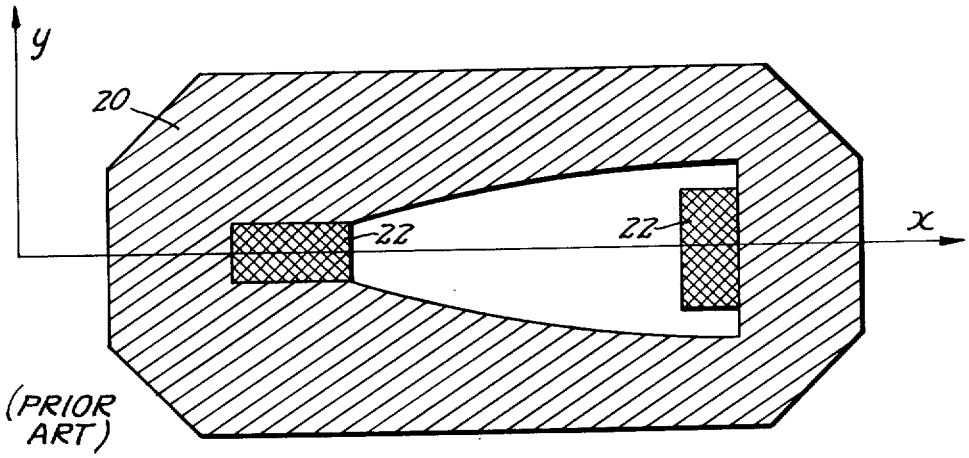
FIG. 13 is a cross-sectional view of another conventional device for generating a magnetic field for use in a betatron.

Turning now to FIG. 13, a conventional device comprises a frame-shaped yoke 20 and is for generating a magnetic field in a space defined inwardly of the yoke 20. The device further comprises coils 22 inwardly protruded from the yoke inside surface. The yoke surface is machined so as to conform to the magnetic equipotential surface and thereby to achieve the desired distribution of the magnetic field. When the device is used to dispose of a beam of charged particles running generally parallel to the z axis, namely, perpendicularly of the plane of the drawing, the beam spreads in the direction of the y axis as well as in the x direction. The space or gap between the opposing yoke inside surfaces, however, is very narrow particularly at the left end portion in the figure.

Figure 14:
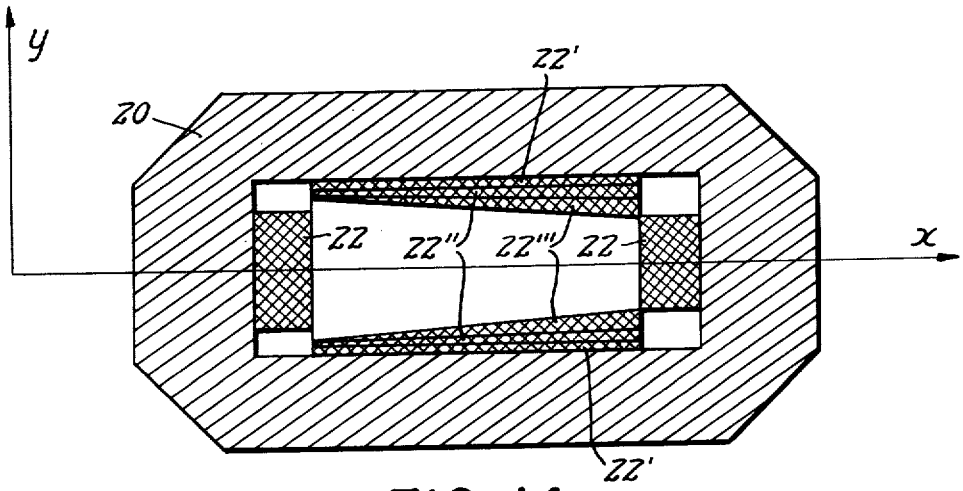
FIG. 14 is a cross-sectional view of a device according to an eleventh embodiment of this invention.

Referring to FIG. 14, a device according to an eleventh embodiment of this invention is for producing a composite magnetic field of various orders, such as first, second, and third orders, so as to minimize the aberration of the focus of a beam of charged particles as is often required in a betatron. The device comprises a frame-shaped yoke member 20 defining a hollow rectangular prismal space. A rectangular x-y-z coordinate system is considered. The z axis runs parallel to the prismal space axis. The x and y axes perpendicularly intersect the yoke inside surfaces of a narrower and a broader width, respectively. A pair of coils 22 are arranged inwardly projecting into the space from the respective narrower yoke inside surfaces. Three layers of coils 22',22'', and 22''' are likewise arranged on the respective broader yoke inside surfaces. Instead of shaping the yoke inside surface in a manner exemplified in FIG. 13, the coils 22'–22''' comprise conductors running parallel to the z axis with the densities per unit abscissa varied so as to produce, when energized, the desired magnetic fields in cooperation with the coil pair 22. It is possible to embed the coils 22, 22', 22'', and/or 22''' in the yoke 20 and to energize only selected one or ones of the coils 22'–22'''.

Figure 15:
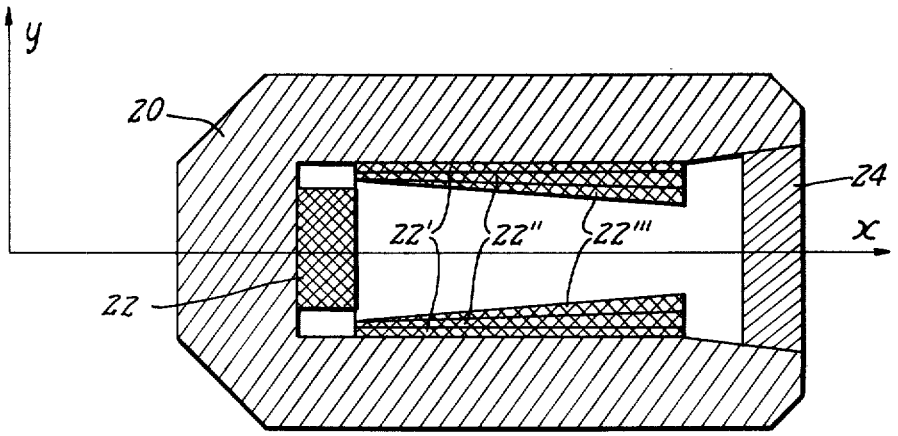
FIG. 15 is a cross-sectional view of a device according to a twelfth embodiment of this invention.

Referring to FIG. 15, a device according to a twelfth embodiment of this invention is similar to that illustrated with reference to FIG. 14. The yoke member 20 comprises a single yoke having a pair of edges to leave a strip-shaped gap perpendicularly of the x axis. A non-magnetic spacer 24 connects the edges.

Figure 16:
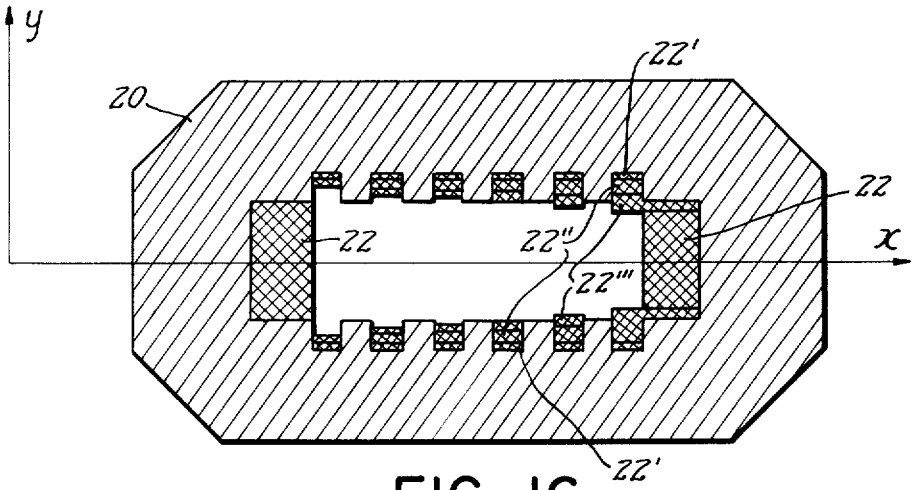
FIG. 16 is a cross-sectional view of a device according to a thirteenth embodiment of this invention.

Referring to FIG. 16, a device according to a thirteenth embodiment of this invention is again similar to that described in conjunction with FIG. 14. Some of the coils 22'–22''' are partly embedded in the yoke 20 and partly protruded from the yoke inside surface inwardly into the space.

Figure 17:
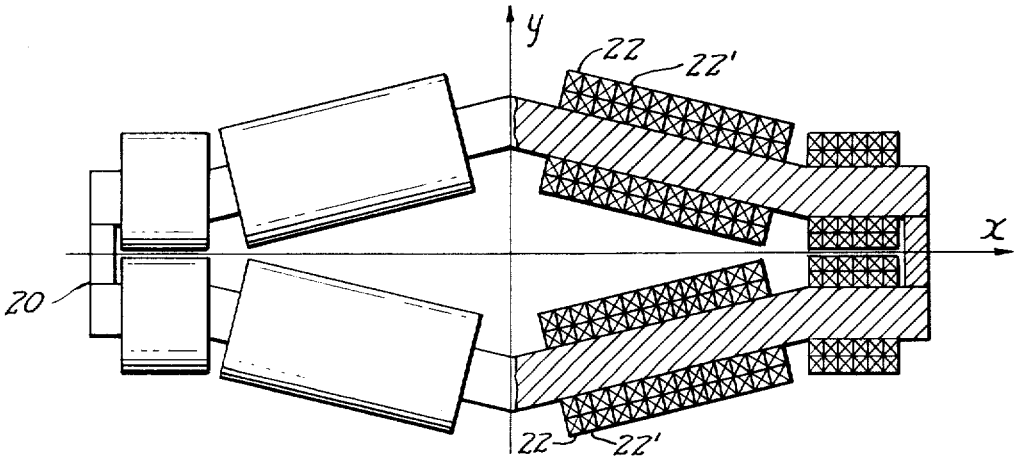
FIG. 17 shows a front view, with parts cut away, of a device according to a fourteenth embodiment of this invention.

Finally referring to FIG. 17, a device according to a fourteenth embodiment of this invention is for generating plural kinds of multipole magnetic fields in a hollow prismal space defined by inside surfaces of a yoke 20. A rectangular x-y-z coordinate system is defined in connection with the space so that the z axis runs along the center axis of the hollow space. The yoke 20 is symmetrical with respect to the x and y axes and has four inclined inside surfaces generally defining the prismal space as a rhombic one, four extension surfaces extended parallel with the x axis and from the respective inclined inside surfaces, and a pair of end inside surfaces intersecting the x axis to connect the extension surfaces. On the inclined and extension inside surfaces, a plural kinds of coils 22 and 22' are alternatingly arranged as illustrated with reference to FIG. 10. Each of the coils 22 and 22' further comprises a pair of coils superposed as shown in FIG. 9. Return windings of the coils 22 and 22' are arranged along the outer surfaces of the yoke 20. In this illustrated example, a quadrupole and a decarupole magnetic field is produced within the hollow space by coil pairs disposed in layers on the inclined and the extension inside surfaces, while a sextipole and an octopole one, by the other coil pairs 22'. In order to produce, for example, the quadrupole magnetic field, the distribution of one of the coil pairs 22 is decided in accordance with Equations (6a) and (4c). Likewise the other magnetic fields are readily produced by the other of the coil pairs 22 and by the coil pairs 22' in accordance with Equations (6b) and (4). Inasmuch as the sextipole, octopole, and decarupole magnetic fields are produced together with the quadrupole one in this embodiment, it is possible to minimize second, third and fourth of aberration in the art of ion optics. As a practical example, the device according to this embodiment for producing the quadrupole, sextipole, octopole, and decarupole fields of 80 Gauss/cm, 0.4 Gauss/cm$^2$, $1.2\times10^{-3}$ Gauss/cm$^3$, and $3.1\times10^{-4}$ Gauss/cm$^4$ comprises a yoke 20 of 1150 mm in width along the x axis, 550 mm in height along the y axis, and 345 mm in length along z axis and coil pairs 22 and 22' of 102720, 41000, 36480 and 35280 AT.

While this invention has thus far been described in connection with several preferred embodiments thereof, it should clearly be understood that other embodiments and modifications are possible within the scope of the appended claims. For example, the coil member 22 may be an inside surface portion of the yoke member 20 with conductivity given by the superconductive phenomenon.

What is claimed is:

1. A method of generating a 2N-pole magnetic field in a hollow space, N being representative of an integer, said magnetic field being derived from a static magnetic potential $\phi$ defined in said space, said method comprising the steps of providing a yoke member having an inside surface which defines said space and provides a plane curve when cut by a plane, providing a coil member having current paths transversely along said yoke member's inside surface of said plane, and causing electric currents to flow through the respective current paths with a distribution of components perpendicular to said plane of said electric currents given by $-d\phi/ds$ where ds represents a differential line element tangential to said plane curve, said yoke member not having a parallel inside surface along which said current paths are arranged for generation of the magnetic field for $N=1$.

2. A method as claimed in claim 1, said current paths being divided into a plurality of groups, M in number, wherein said current flowing step comprises the step of first causing M-th electric currents to flow through said current paths of the respective groups with the distribution of components perpendicular to said plane of the M-th electric currents given by $-d\phi_m/d$ where M represents each of successive integers of a sequence starting at 1 and ending at M and $\phi_m$ represents a partial static magnetic potential, the first-mentioned said 2N-pole magnetic potential $\phi$ being equal to a sum of all said partial magnetic potentials.

3. A method as claimed in claim 1, said yoke member comprising a hollow prismal yoke giving a regular polygon of 2N sides as said plane curve when said plane is perpendicular to edges of the inside surface of said yoke, where N represents an integer, wherein said distribution along each of said 2N sides is substantially equal to $Nx_0^{N-1}$ where $x_0$ represents a distance between said each side and the center of said polygon whereby said static magnetic potential is given by:

$$\phi=-\mathrm{Im}(x+iy)^N,$$

where Im represents the imaginary part of the argument enclosed with a pair of parentheses to the power N, i represents the imaginary unit, and x and y represent abscissa and ordinate of a rectangular x-y coordinate system having an origin at said center and an x axis perpendicularly bisecting one of said 2N sides.

4. A method as claimed in claim 3, N being equal to two, wherein said distribution is constant whereby a quadrupole magnetic field is produced as said 2N-pole magnetic field with poles disposed along said edges.

5. A method as claimed in claim 1, said yoke member comprising a hollow prismal yoke giving an equilateral quadrilateral as said plane curve when said plane is perpendicular to edges of the inside surface of said yoke, wherein said distribution is given by:

$$\mathrm{Im}(N[x+ib(1-x/a)]^{N-1}[1-ib/a]),$$

where Im represents the imaginary part of the argument enclosed with a pair of parentheses of the first and last occurrences, i represents the imaginary unit, x and y represent abscissa and ordinate of a rectangular x-y coordinate system having an origin at the center of said quadrilateral and x and y axes passing through said edges, and a and b represent x and y intercepts of one of the sides of said quadrilateral, whereby a 2N-pole magnetic field is produced as said 2N-pole magnetic field.

6. A method as claimed in claim 5, wherein said distribution is given by:

$$\mathrm{Im}(2[x+ib(1-x/a)][1-ib/a]),$$

whereby a quadrupole magnetic field is produced as said 2N-pole magnetic field with poles disposed along the bisectors between adjacent pairs of said edges.

7. A method as claimed in claim 1, said yoke member comprising a hollow rectangular prismal yoke giving a rectangle as said plane curve, wherein the distribution along a pair of opposing sides of said rectangle is given by a first constant and the distribution along another pair of opposing sides of said rectangle is given by a second constant, whereby a quadrupole magnetic field is produced as said 2N-pole magnetic field with poles disposed along edges of the inside surface of said yoke.

8. A method as claimed in claim 1, said yoke member comprising a hollow rectangular prismal yoke giving a rectangle as said plane curve when said plane is perpendicular to edges of the inside surface of said yoke, wherein the distribution along a first pair of opposing sides of said rectangle is given by $3a^2-3y^2$ and the distribution along a second pair of opposing sides of said rectangle is given by 6bx, where x and y represent abscissa and ordinate of a rectangular coordinate system having an origin at the center of said rectangle and x and y axes perpendicularly bisecting said first and second pair opposing sides, respectively, and a and b represent the abscissa of one of said first pair opposing sides and the ordinate of one of said second pair opposing sides, respectively, whereby a sextipole magnetic field is produced as said 2N-pole magnetic field.

9. A device for generating a 2N-pole magnetic field in a hollow space, N being representative of an integer, said magnetic field being derived from a static magnetic potential $\phi$ defined in said space, said device comprising a yoke member having an inside surface which defines said space and gives a plane curve when cut by a plane, said device further comprising a coil member having current paths transversely along said yoke member's inside surface of said plane, means for applying electric currents to said current paths with a distribution of components perpendicular to said plane of said electric currents given by $-d\phi/ds$ where ds represents a differential line element tangential to said plane curve, said yoke member not having a parallel inside surface along which said current paths are arranged for generation of the magnetic field for $N=1$.

10. A device as claimed in claim 9, wherein said yoke member consists of a single yoke.

11. A device as claimed in claim 9, wherein said yoke member comprises a yoke having a pair of edges with a space curve interposed therebetween, said space curve running along a locus of a pole of said magnetic field.

12. A device as claimed in claim 11, wherein said yoke member further comprises a non-magnetic spacer between said edges.

13. A device as claimed in claim 9, wherein said current paths are divided into a plurality of groups, N in number, said means comprising means for causing first through M-th electric currents to flow through said current paths of the respective groups with the distribution of components perpendicular to said plane of the M-th electric currents given by $d\phi_m/ds$ where m represents each of successive integers of a sequence starting at 1 and ending at M and $\phi_m$ represents a partial static magnetic potential, the first-mentioned magnetic potential $\phi$ being equal to a sum of all said partial magnetic potentials.

14. A device as claimed in claim 9, wherein said yoke member comprises a hollow prismal yoke having inside lateral surfaces, 2N in number, said inside lateral surfaces being contiguous to one another at edges and giving a polygon of 2N sides as said plane curve when said plane is perpendicular to said edges, said coil member comprising conductors as said current paths, said conductors being extended parallel along each of said inside lateral surfaces to said edges.

15. A device as claimed in claim 14, wherein said polygon is a regular polygon, the distribution along each of said 2N sides being substantially equal to $Na^{N-1}$ where a represents a distance between said each side and the center of said regular polygon, whereby said static magnetic potential is given by:

$$\phi=-\mathrm{Im}(x+iy)^N,$$

where Im represents the imaginary part of the argument enclosed with a pair of parentheses to the power N, i represents the imaginary unit, x and y represent abscissa and ordinate of a rectangular x-y coordinate system having an origin at said center and an x axis perpendicularly bisecting one of said 2N sides.

16. A device as claimed in claim 15, N being equal to two, wherein said distribution is given by a 2a whereby a quadrupole magnetic field is produced as said 2N-pole magnetic field with poles disposed along said edges.

17. A device as claimed in claim 9, wherein said yoke member has a shape of a hollow quadrilateral prism having four inside surfaces that are contiguous to one another along edges of said prism and given an equilateral quadrilateral, as said plane when said plane is perpendicular to said edges said distribution being given by:

$$\mathrm{Im}(N[x+ib(1-x/a)]^{N-1}[1-ib/a]),$$

where Im represents the imaginary part of the argument enclosed with a pair of parentheses of the first and last occurrences, i represents the imaginary unit, x and y represent abscissa and ordinate of a rectangular x-y coordinate system having an origin at the center of said quadrilateral and x and y axes passing through said edges, and a and b represent x and y intercepts of one of the sides of said quadrilateral, whereby said 2N-pole magnetic field is produced.

18. A device as claimed in claim 17, wherein said distribution is given by:

$$\mathrm{Im}(2[x-ib(1-x/a)][1-ib/a]),$$

whereby a quadrupole magnetic field is produced as said 2N-pole magnetic field with poles disposed along the bisectors parallel to said edges of said inside lateral surfaces.

19. A device as claimed in claim 14, wherein said polygon is a rectangle having a first and a second pair of opposing sides, the distribution along said first pair opposing sides being given by a first constant, the distribution along said second pair opposing sides being given by a second constant, whereby a quadrupole magnetic field is produced as the first-mentioned magnetic field with poles disposed along said edges.

20. A device as claimed in claim 9, wherein said yoke member has a shape of a hollow rectangular prism having four inside surfaces that are contiguous to one another along edges of said prism and give as said plane curve a rectangular having a first and a second pair of opposing sides, when said plane is perpendicular to said edges, the distribution along said first pair opposing sides being given by $3a^2-3y^2$, the distribution along said second pair opposing sides being given by 6bx, where x and y represent abscissa and ordinate of a rectangular x-y coordinate system having an origin at the center of said rectangle and x and y axes perpendicularlybisecting said first and second pair opposing sides, respectively, and a and b represent the abscissa of one of said first pair opposing sides and the ordinate of one of said second pair opposing sides, respectively, whereby a sextipole magnetic field is produced as said 2N-pole magnetic field.

21. A device as claimed in claim 14, wherein said conductors do not substantially protrude inwardly from said yoke inside lateral surfaces into said space.

22. A device as claimed in claim 14, wherein predetermined ones of said conductors do not protrude inwardly from said yoke inside lateral surfaces into said space while the remaining ones of said conductors at least partially protrude inwardly into said space from said yoke inside lateral surfaces.

23. A device for generating a composite magnetic field in a hollow space, said device comprising a yoke member having an inside surface which defines said space and gives a plane curve when cut by a plane, a first and a second coil member, each having a plurality of current paths transversely of said plane along said yoke member inside surface, and means for causing electric currents to flow through the respective current paths of the first and second coil members, the current paths of said first and second coil members being distributed along said plane curve so that distributions of components perpendicular to said plane of said electric currents are given by $-d\phi_1/ds_1$ and $-d\phi_2/ds_2$ where $\phi_1$ and $\phi_2$ represent static magnetic potentials of components of said composite magnetic field produced by the electric currents flowing through said first and second coil members, respectively, and $ds_1$ and $ds_2$ represent differential line elements tangential to said plane curve at the current paths of said first and second coil members, respectively.

24. A device as claimed in claim 23, wherein said second coil member is superposed on said first coil member.

25. A device as claimed in claim 23, wherein said first and second coil members are alternatingly arranged.

26. A device as claimed in claim 23, further comprising a third and a fourth coil member superposed on said first and said second coil members, respectively, each having current paths transversely of said plane along said yoke member inside surface, said device still further comprising means for causing electric currents to flow through the current paths of said third and fourth coil members, the current paths of said third and fourth coil members being distributed along said plane curve so that distributions of the electric currents flowing through said third and fourth coil members are given by $-d\phi_3/ds_3$ and $-d\phi_4/ds_4$ where $\phi_3$ and $\phi_4$ represent static magnetic potentials of those components of said composite magnetic field which are produced by the electric currents flowing through the respective ones of said third and fourth members in superposition on the component magnetic fields produced by the electric currents flowing through said first and second coil members, the symbols $ds_3$ and $ds_4$ representing differential line elements tangential to said plane curve at the current paths of said third and fourth coil members, respectively.

27. A device as claimed in claim 18, wherein said conductors do not substantially protrude inwardly from said yoke inside lateral surfaces into said space, said coil member having said conductors as current paths.

28. A device as claimed in claim 18, wherein predetermined ones of said conductors do not protrude inwardly from said yoke inside lateral surfaces into said space while the remaining ones of said conductors at least partially protrude inwardly into said space from said yoke inside lateral surfaces.

* * * * *